(12) United States Patent
Liu et al.

(10) Patent No.: US 12,543,362 B2
(45) Date of Patent: Feb. 3, 2026

(54) CONTACT FIELD PLATE

(71) Applicant: Taiwan Semiconductor Manufacturing Company, Ltd., Hsinchu (TW)

(72) Inventors: Tao-Cheng Liu, Hsinchu (TW); Ying-Hsun Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 730 days.

(21) Appl. No.: 17/715,900

(22) Filed: Apr. 7, 2022

(65) Prior Publication Data

US 2023/0326979 A1    Oct. 12, 2023

(51) Int. Cl.
| | | |
|---|---|---|
| *H01L 29/40* | (2006.01) | |
| *H01L 21/765* | (2006.01) | |
| *H10D 30/01* | (2025.01) | |
| *H10D 30/65* | (2025.01) | |
| *H10D 64/00* | (2025.01) | |

(52) U.S. Cl.
CPC .......... *H10D 64/111* (2025.01); *H01L 21/765* (2013.01); *H10D 30/0281* (2025.01); *H10D 30/65* (2025.01)

(58) Field of Classification Search
CPC ................ H01L 29/402; H01L 21/765; H01L 29/66681; H01L 29/7816; H01L 29/66477; H01L 29/66068; H01L 29/78
See application file for complete search history.

(56) References Cited

U.S. PATENT DOCUMENTS

2019/0334032 A1*  10/2019  Ho .................... H01L 29/66659

FOREIGN PATENT DOCUMENTS

| CN | 110943123 A | 3/2020 |
|---|---|---|
| CN | 112951913 A | 6/2021 |
| TW | 202044582 A | 12/2020 |
| TW | 202137552 A | 10/2021 |

OTHER PUBLICATIONS

First office action received in the counterpart Taiwan application 112111825, mailed on Jun. 20, 2024.

* cited by examiner

*Primary Examiner* — Mohammed R Alam
(74) *Attorney, Agent, or Firm* — KILPATRICK TOWNSEND & STOCKTON LLP (57) ABSTRACT

A semiconductor device and method of forming the semiconductor device are disclosed. The method includes forming first and second conductive structures on a semiconductor substrate, forming one or more dielectric layers between the first and second conductive structures, covering the one or more dielectric layers with a first masking layer, forming a first opening in the first masking layer, depositing a conductive material in the first opening to form a field plate structure, and electrically connecting the field plate structure to another conductor.

17 Claims, 7 Drawing Sheets

CONTACT FIELD PLATE

TECHNICAL FIELD

The subject matter described herein relates to a field plate, and more particularly to a field plate formed using a contact.

BACKGROUND

Semiconductor manufacturing processes include numerous fabrication steps or processes, each of which contributes to the formation of one or more semiconductor layers. Some layers are conductive and provide electrical connections between devices of an electronic system. Some layers may be formed, for example, by doping sections of a crystalline semiconductor substrate. In addition, one or more layers may be formed by adding, for example, conductive, resistive, and/or insulative layers on the crystalline semiconductor substrate.

Some semiconductor devices use field plates, for example, to manage electric fields in the devices.

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and wiring portions formed inside the semiconductor portions.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

When practical, similar reference numbers denote similar structures, features, or elements.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Transistor and other BCD (Bipolar Junction, CMOS, and/or DMOS) devices are often constructed to have field plates. Field plates are conductive elements, which are placed over a portion of the device, such as a channel region, to enhance the performance of the device by inducing electric fields. For example, because of the fields generated with the field plate, the peak electric fields the device experiences is reduced. For example, by interfering with the electric field generated by a gate electrode, a transistor device can achieve higher breakdown voltages. For example, LDMOS (laterally diffused metal oxide semiconductor) transistor devices often comprise field plates that extend from a channel region to an adjacent drift region disposed between the channel region and a drain region.

Field plates can be formed in a number of different ways. For example, field plates may be formed by extending a conductive gate material (e.g., polysilicon) from a gate electrode towards a drift region. However, in such configurations the field plate is synchronized to a gate bias, which burdens the gate-to-drain capacitance (Cgd) and worsens the switching losses of the device. Alternatively, the conductive gate material can be patterned to form a separate field plate. Such configurations reduce the gate-to-drain capacitance (Cgd), but placement of the field plates are often restricted by design rules. In yet another alternative, non-gate materials can be used for field plate formation. However, such solutions use additional processing steps that increase the fabrication cost of a resulting integrated chip.

In some alternatives, field plates may be formed by etching through an ILD layer and optionally partly through one or more dielectric layers beneath the ILD layer to generate a void. Subsequently, the etched void may be filled with a conductive material. Because controlling the depth of etching through the ILD and any dielectric layers is difficult, over or under etching is likely. Over etching causes a short or leakage path between the field plate and the underlying semiconductor substrate. Under etching causes the field plate to be less effective than it could be.

As discussed in further detail below, in some embodiments, a field plate is formed above one or more dielectric layer having a well-controlled thickness. The well-controlled thickness of the dielectric layer results in low yield loss for shorting of the field plate and the semiconductor substrate, and consistent effectiveness of the formed field plate.

Accordingly, the present disclosure relates to generating semiconductor devices having a field plate made from non-gate materials, where the field plate is formed without etching through an ILD layer. Instead, the field plate is formed by etching an opening in a masking layer, where controlling the depth of the etch is much more precise when compared with depth control when etching through an ILD layer, and subsequently filling the etched opening with a field plate material. In some embodiments, the depth is controlled so that the opening extends through the masking layer. In some embodiments, the depth is controlled so that the opening extends through the masking layer and into a first dielectric layer, for example, comprising a CESL material. In some embodiments, the depth is controlled so that the opening extends through the masking layer, through a first dielectric layer, for example, comprising a CESL material, and into a second dielectric layer, for example, comprising an RPO material.

FIGS. 1-11 illustrate cross-sectional views of some embodiments showing a method of forming a transistor device having a conductive etch stop layer that defines a field plate. The structure of the illustrated transistor has a short source to drain distance, which results in advantageously low on resistance of the transistor device. Although the cross-sectional views 100-1100 shown in FIGS. 1-11 are described with reference to a particular device and particular methods of forming the device, it will be appreciated that the structures shown in FIGS. 1-11, and the steps for forming the structures are not limited to the particular structures or steps discussed, as other structures and/or other steps may be used, as understood by those of skill in the art. For example, in some embodiments, substantially the same structures may be used, for example to form field plates, in other BCD devices. In addition, each of the structures or steps discussed may stand alone separate of the other structures and/or steps discussed.

Figure 1:
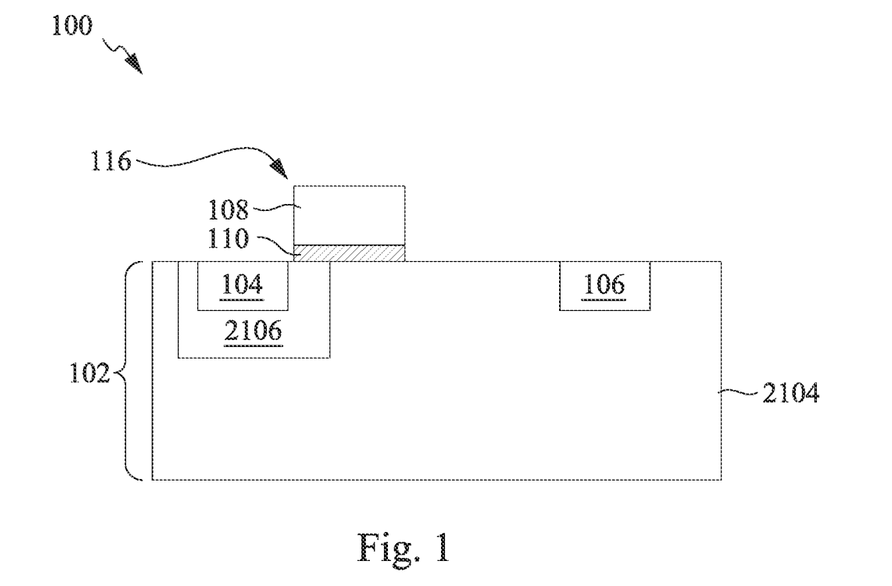
FIGS. 1-11 illustrate cross-sectional views of some embodiments showing a method of forming a transistor device having a conductive etch stop layer that defines a field plate structure.

As shown in cross-sectional view 100 of FIG. 1, a semiconductor substrate 102 is illustrated. The semiconductor substrate may comprise silicon or other semiconductor materials and may be covered by an insulating layer, for example. The semiconductor substrate 102 may comprise silicon oxide over single-crystal silicon, for example. Compound semiconductors, such as GaAs, InP, Si/Ge, or SiC, as examples, may be used in place of silicon. The semiconductor substrate 102 may comprise a silicon-on-insulator (SOI) or a germanium-on-insulator (GOI) substrate, as examples. A plurality of integrated circuit dies manufactured on a single semiconductor substrate 102 and are then singulated at scribe lines, separating the semiconductor substrate 102 into single dies, each having a separate circuit.

a semiconductor substrate 102 is selectively implanted to form a plurality of implantation regions (e.g., well regions, contact regions, etc.). In some embodiments, the semiconductor substrate 102 may be selectively implanted to form a body region 2106, a drift region 2104, a source region 104, and a drain region 106. In other embodiments, the semiconductor substrate 102 may be selectively implanted to form different implantation regions (e.g., such as any of those used to form another or another type of semiconductor device). In some embodiments, the plurality of implantation regions may be formed by selectively masking the semiconductor substrate 102 (e.g., using a photoresist mask) and then introducing high-energy dopants (e.g., p-type dopant species such as boron or n-type dopants such as phosphorous) into exposed areas of the semiconductor substrate 102.

A gate structure 116 is formed over the semiconductor substrate 102 between the source region 104 and the drain region 106. The gate structure 116 may be formed by depositing a gate dielectric layer 110 over the semiconductor substrate 102, and by depositing a gate electrode material 108 over the gate dielectric layer 110. The gate dielectric layer 110 and the gate electrode material 108 may be subsequently patterned (e.g., etched according to a photoresist mask and/or a hard mask) to define the gate structure 116.

Figure 2:
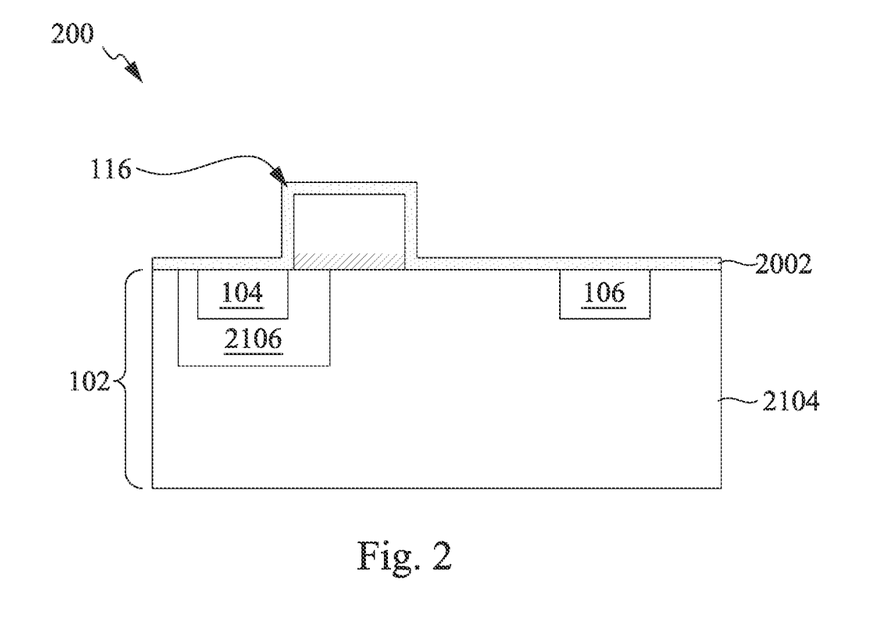

As shown in cross-sectional view 200 of FIG. 2, a resist protective oxide (RPO) 2002 is formed over the gate structure 116. The RPO 2002 laterally extends from directly over the gate structure 116 beyond an outermost sidewall of the gate structure 116. The RPO 2002 is configured, for example, to block the formation of a silicide on underlying layers. In some embodiments, the RPO 2002 may be deposited by a vapor deposition technique (e.g., CVD). In some embodiments, the RPO 2002 may, for example, comprise silicon dioxide ($SiO_2$), silicon nitride, or the like. In some embodiments, other materials are used. The RPO 2002 may, for example, have a thickness between 2 and 1000 angstroms. In some embodiments, other thicknesses are used.

Figure 3:
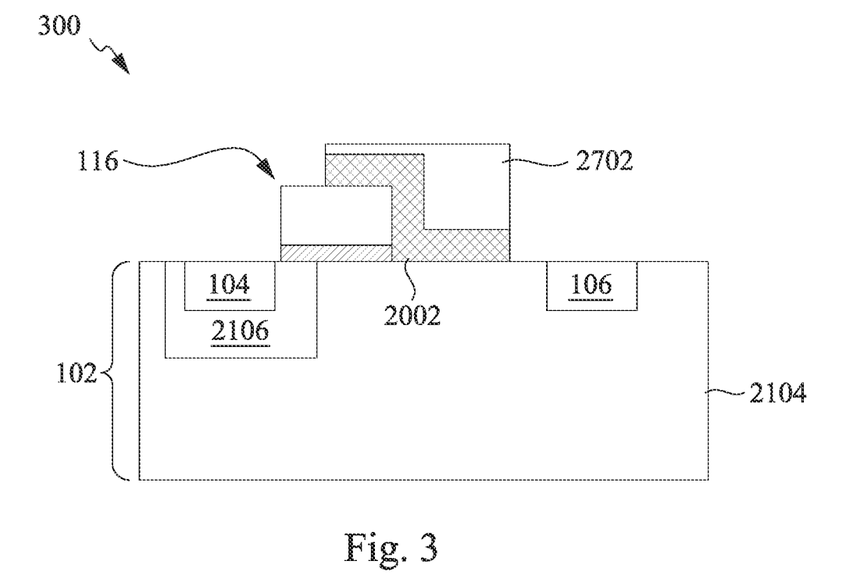

As shown in cross-sectional view 300 of FIG. 3, in some embodiments, the RPO 2002 may be patterned using a same masking layer 2702 (e.g., photoresist layer) and etching process.

Figure 4:
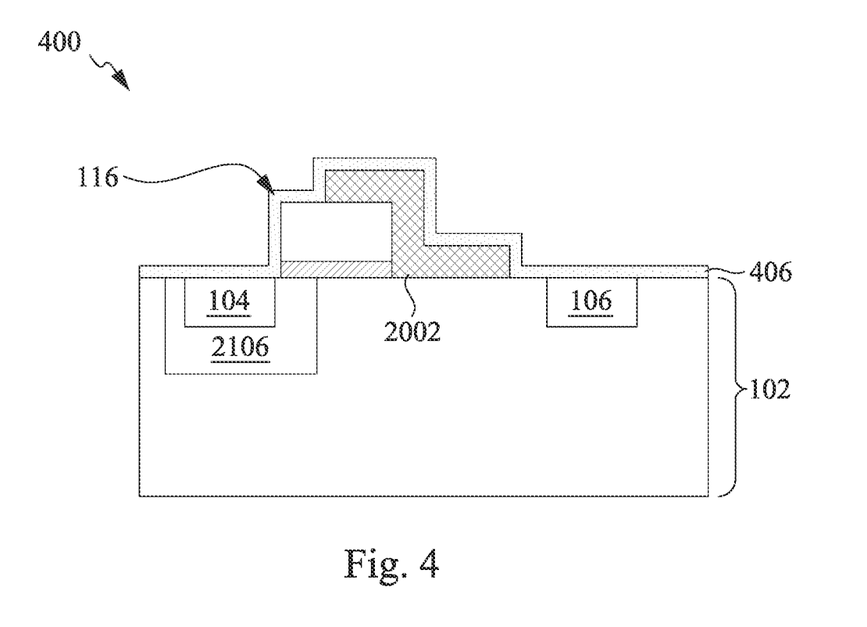

As shown in cross-sectional view 400 of FIG. 4, a contact etch stop layer (CESL) 406 is formed over the semiconductor substrate 102 and the RPO 2002. In some embodiments, the CESL 406 may be formed by a vapor deposition process. The CESL may comprise a nitride layer (e.g., $Si_3N_4$), a carbide layer (SiC), or the like. In some embodiments, other materials are used. The CESL 406 may, for example, have a thickness between 2 and 500 angstroms. In some embodiments, other thicknesses are used.

Figure 5:
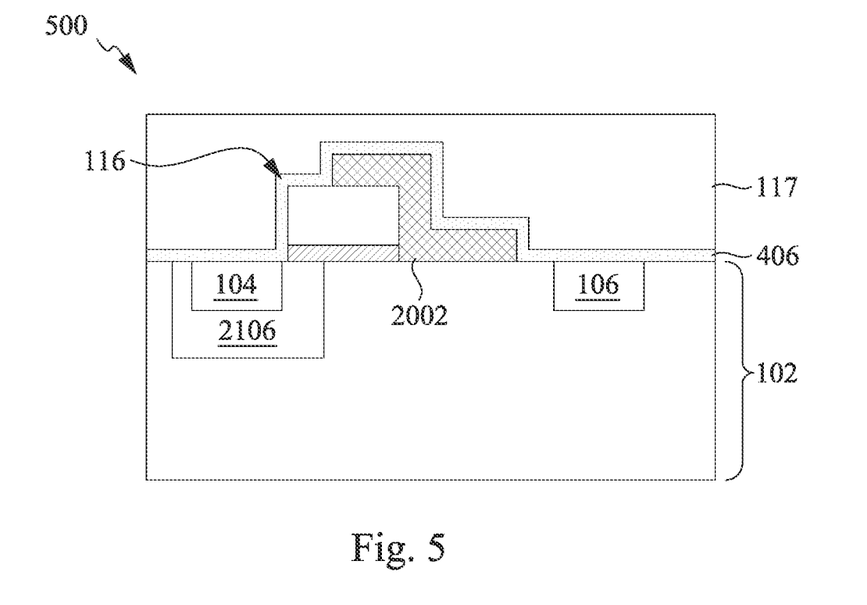

As shown in cross-sectional view 500 of FIG. 5, a masking layer, such as a photoresist and/or a hard mask layer 117 is formed over the CESL 406. Standard photoresist and/or hard mask materials known to those of skill in the art may be used.

Figure 6:
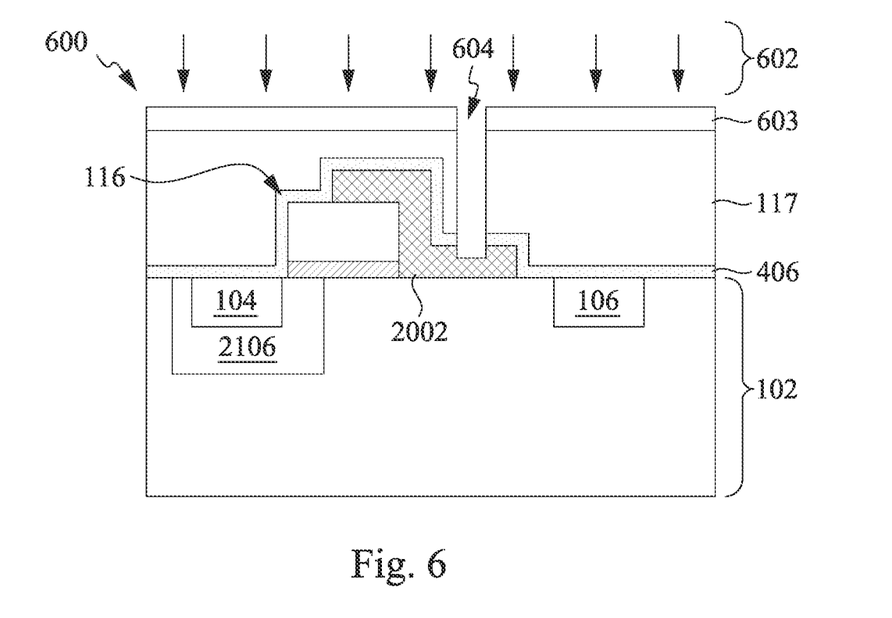

As shown in cross-sectional view 600 of FIG. 6, the photoresist and/or a hard mask layer 117 is selectively exposed to an etchant 602 (e.g., according to masking layer 603) to form a field plate opening 604 within the photoresist and/or hard mask layer 117. The etchant 602 used to form the field plate opening 604 is selected to etch through the material of the photoresist and/or hard mask layer 117. In some embodiments, the field plate opening 604 also extends into the CESL 406, so that sidewalls of the CESL 406 partially define the field plate opening 604. In some embodiments, the field plate opening 604 further extends through the CESL 406 into the RPO 2002, so that sidewalls of the RPO 2002 also partially define the field plate opening 604. In some embodiments, the CESL 406 defines the bottom of the field plate opening 604. In some embodiments, the RPO 2002 defines the bottom of the field plate opening 604. In some embodiments, the bottom edge at the bottom of the field plate opening 604 are rounded.

In some embodiments, the field plate opening 604 has a length dimension along the illustrated plane between about 10 Angstroms and about 6000 Angstroms.

In some embodiments, the field plate opening 604 may reduce a thickness of the combination of the CESL 406 and the RPO 2002 by an amount that is less than or greater than about 10 Angstroms, about 20 Angstroms, about 50 Angstroms, about 100 Angstroms, about 200 Angstroms, about 500 Angstroms, about 1000 Angstroms, about 2000 Angstroms, or by another amount.

In some embodiments, the field plate opening 604 may reduce a thickness of the combination of the CESL 406 and the RPO 2002 by less than or greater than about 1 percent, about 2 percent, about 5 percent, about 10 percent, about 15 percent, about 20 percent, about 25 percent, about 30 percent, about 35 percent, about 40 percent, about 45 percent, about 50 percent, about 55 percent, about 60 percent, about 65 percent, about 70 percent, about 75 percent, about 80 percent, about 85 percent, about 90 percent, about 95 percent, about 96 percent, about 97 percent, about 98 percent, about 99 percent, about 99.5 percent, about 99.6 percent, about 99.7 percent, about 99.8 percent, about 99.9 percent, or by another percentage.

In some embodiments, a thickness of the combination of the CESL 406 and the RPO 2002 directly below the field plate opening 604 and above the semiconductor substrate 102 is in a range of between about 0 Angstroms and about 1,000 Angstroms. In some embodiments, the thickness of the combination of the CESL 406 and the RPO 2002 directly below the field plate opening 604 and above the semiconductor substrate 102 is in a range of between about 300 Angstroms and about 900 Angstroms. In some embodiments, the thickness of the combination of the CESL 406 and the RPO 2002 directly below the field plate opening 604 and above the semiconductor substrate 102 is less than or greater than about 1 Angstrom, about 2 Angstroms, about 3 Angstroms, about 4 Angstroms, about 5 Angstroms, about 10 Angstroms, about 15 Angstroms, about 20 Angstroms, about 25 Angstroms, about 40 Angstroms, about 50 Angstroms, about 75 Angstroms, about 100 Angstroms, about 200 Angstroms, about 250 Angstroms, about 400 Angstroms, about 500 Angstroms, about 750 Angstroms, about 1000 Angstroms, about 1500 Angstroms, about 2000 Angstroms, or another amount.

In some embodiments, the field plate opening 604 has an angle between about 70 and about 90 with respect to an upper surface of semiconductor substrate 102.

Figure 7:
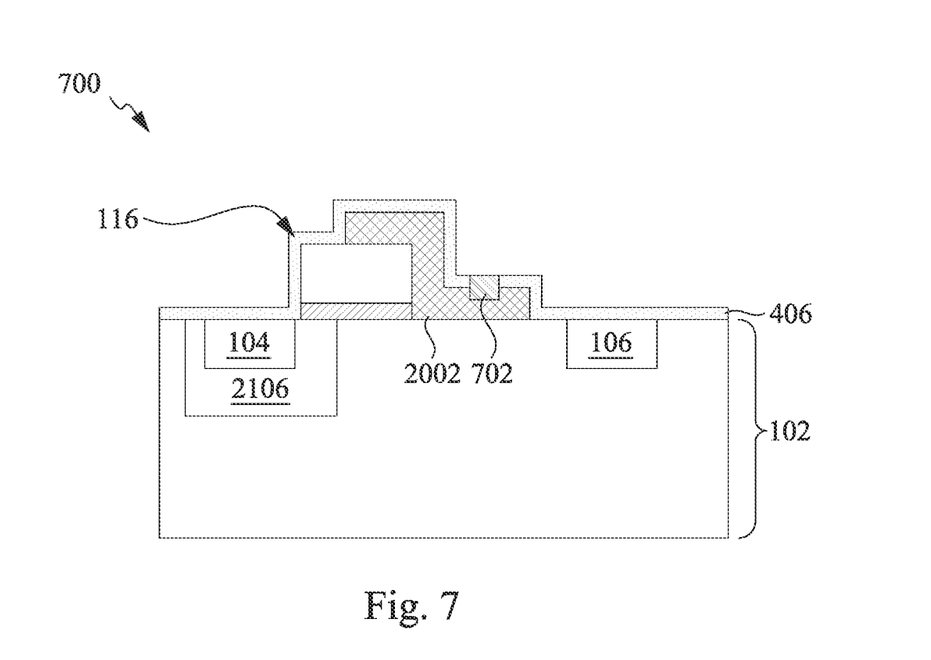

As shown in cross-sectional view 700 of FIG. 7, the field plate opening 604 is filled or partially filled with one or more conductive etch stop materials to form a field plate structure 702. In some embodiments, the one or more conductive etch stop materials may be deposited by way of a vapor deposition technique (e.g., CVD, PVD, PE-CVD, etc.) and/or a plating process (e.g., an electroplating or electro-less plating process). Subsequently, the photoresist and/or a hard mask layer 117 may be removed. In some embodiments, a wet or dry etching process may be subsequently performed to remove excess of the one or more conductive etch stop materials, for example, with a hard mask or photoresist material protecting the conductive etch stop materials of the field plate structure 702.

In some embodiments, the one or more conductive etch stop materials may comprise tungsten (W), titanium (Ti), copper (Cu), nickel (Ni), cobalt (Co), titanium nitride (TiN), and/or tantalum nitride (TaN). In some embodiments, other materials may be used. In some embodiments, a diffusion barrier layer and/or a liner layer may be deposited into the field plate opening 604 prior to depositing the one or more conductive etch stop materials.

Figure 8:
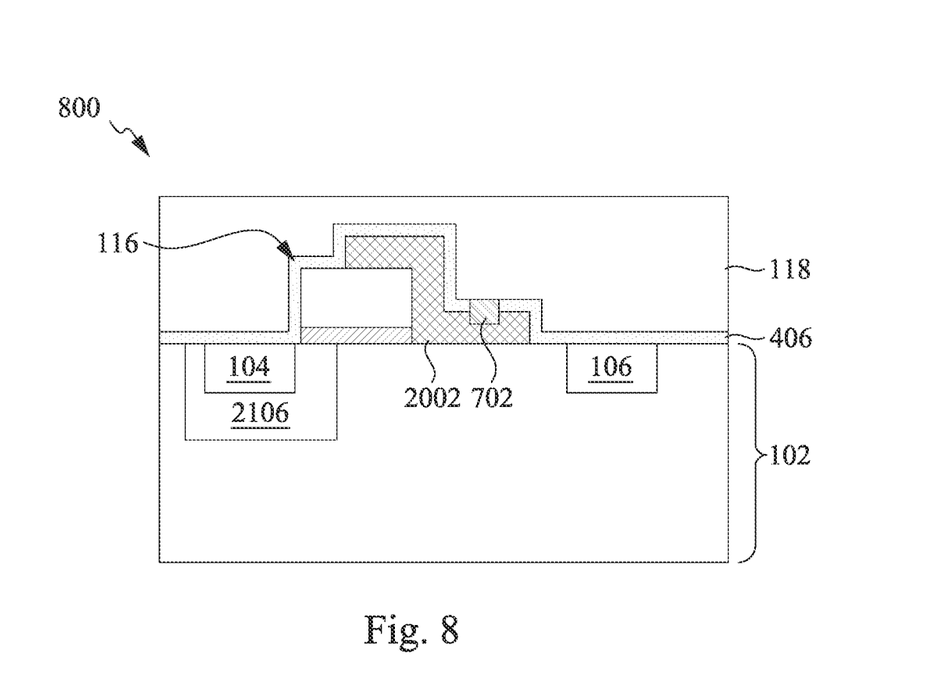

As shown in cross-sectional view 800 of FIG. 8, a first inter-layer dielectric (ILD) layer 118 is formed over the CESL 406 and the field plate structure 702. In some embodiments, the first ILD layer 118 may comprise an oxide (e.g., SiO2), an ultra-low k dielectric material, a low-k dielectric material (e.g., SiCO), or the like. In some embodiments, other materials are used. In some embodiments, the first ILD layer 118 may be formed by a vapor deposition process. In some embodiments, other processes are used to deposit the first ILD layer 118.

Figure 9:
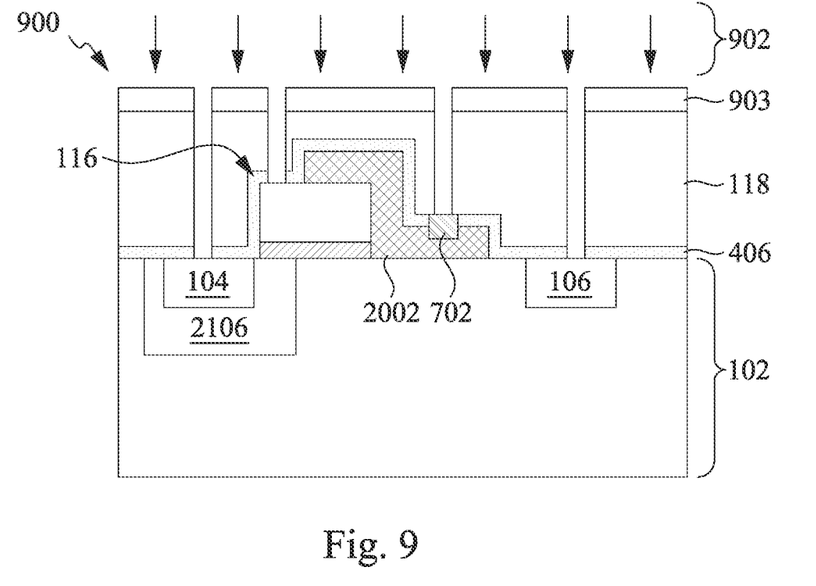

As shown in cross-sectional view 900 of FIG. 9, the first ILD layer 118 is selectively exposed to an etchant 902 (e.g., according to masking layer 903) to form contact openings and a field plate contact opening within the first ILD layer 118. In some embodiments, the field plate contact opening extends partly into the field plate structure 702.

In some embodiments, the field plate contact opening exposing the field plate structure 702 has a lateral contact dimension shown in FIG. 9 which is different from a lateral filed plate dimension defined by the field plate opening 604 illustrated in FIG. 6. As illustrated, in the view of FIG. 9, the field plate structure 702 is wider than the field plate contact opening exposing the field plate structure 702. In some embodiments, the field plate contact opening exposing the field plate structure 702 is wider than the field plate structure 702.

In some embodiments, the width of the field plate structure 702 and the field plate contact opening exposing the field plate structure 702 differ by less than or greater than about 1 percent, about 2 percent, about 5 percent, about 10 percent, about 15 percent, about 20 percent, about 25 percent, about 30 percent, about 35 percent, about 40 percent, about 45 percent, about 50 percent, about 55 percent, about 60 percent, about 65 percent, about 70 percent, about 75 percent, about 80 percent, about 85 percent, about 90 percent, about 95 percent, about 96 percent, about 97 percent, about 98 percent, about 99 percent, about 100 percent, 150 percent, 200 percent, 250 percent, 300 percent, 400 percent, 500 percent, 1000 percent, or by another percentage.

The etchant 902 used to form the contact and field plate openings is selected to etch through a material of the first ILD layer 118. However, because the field plate structure 702 is formed of an etch stopping or etch reducing conductive material, the field plate structure 702 is able to resist etching from the etchant 902 to a higher degree. In some embodiments, the field plate opening extends into the field plate structure by less than about 2 Angstroms, about 5 Angstroms, about 10 Angstroms, about 25 Angstroms, about 50 Angstroms, about 100 Angstroms, about 200 Angstroms, about 300 Angstroms, about 400 Angstroms, about 500 Angstroms, about 750 Angstroms, or about 850 Angstroms. The field plate structure 702 thereby allows the contact openings to extend to the semiconductor substrate 102, while preventing the field plate opening from undesirably extending to the semiconductor substrate 102.

Use of the field plate structure 702 also allows for a high degree of uniformity in etching depths and dielectric distance between the field plate structure 702 and the semiconductor substrate at different locations on a single substrate, between substrates of a same lot, and/or over substrates of different lots. In some embodiments, the coefficient of variation (CV) of the distribution of the dielectric distance between the field plate structure and the semiconductor substrate at different locations on a single substrate, between substrates of a same lot, and/or over substrates of different lots is less than about 0.01%, about 0.02%, about 0.05%, about 0.1%, about 0.2%, about 0.5%, about 1%, about 2%, about 5%, about 10%, about 20%, about 30%, or about 40%.

Figure 10:
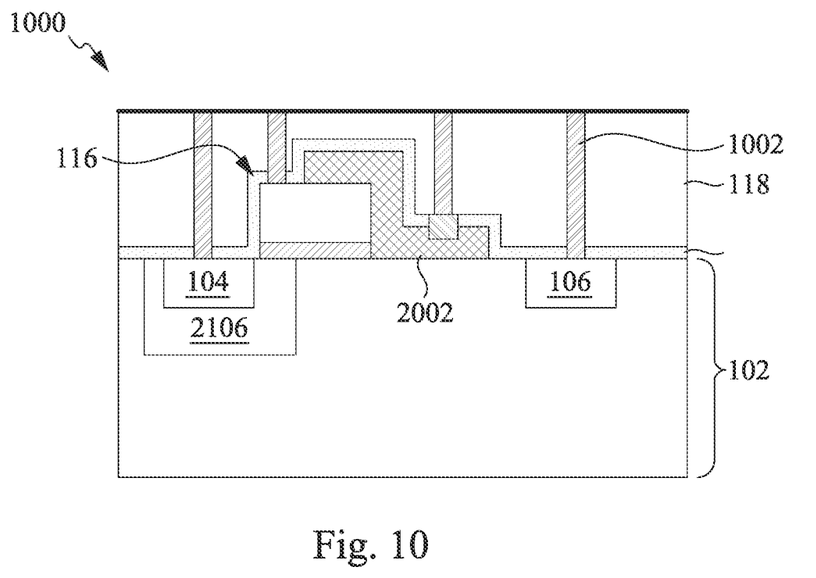

As shown in cross-sectional view 1000 of FIG. 10, the contact and the field plate openings are filled with one or more conductive materials 1002. In some embodiments, the one or more conductive materials may be deposited by way of a vapor deposition technique (e.g., CVD, PVD, PE-CVD, etc.) and/or a plating process (e.g., an electroplating or electro-less plating process). A planarization process (e.g., chemical mechanical planarization) may be subsequently performed to remove excess of the one or more conductive materials and to form a planar surface. In some embodiments, the one or more conductive materials may comprise tungsten (W), titanium (Ti), titanium nitride (TiN), and/or tantalum nitride (TaN). In some embodiments, a diffusion barrier layer and/or a liner layer may be deposited into the contact and/or field plate openings prior to depositing the one or more conductive materials.

Figure 11:
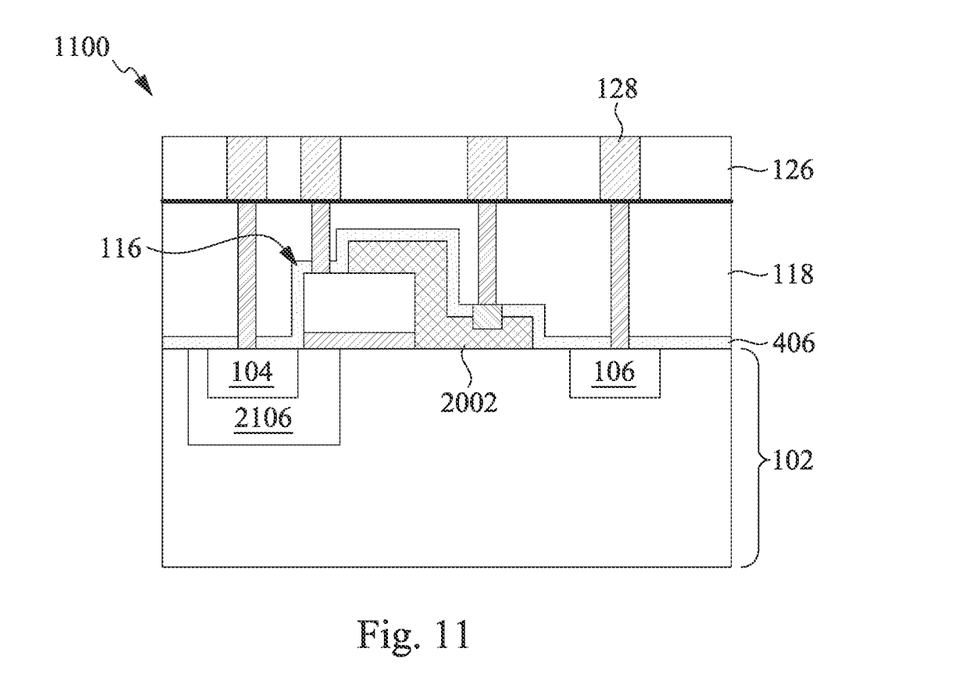

As shown in cross-sectional view 1100 of FIG. 11, a second ILD layer 126 is formed over the first ILD layer 118 and a first back-end-of-the-line (BEOL) metal wire layer 128 is formed within the second ILD layer 126. In various embodiments, the second ILD layer 126 may be formed by depositing a second ILD material over the first ILD layer 118. The second ILD layer 126 is subsequently etched to form trenches extending within the second ILD layer 126. The trenches are filled with a conductive material and a planarization process (e.g., CMP) is performed to remove excess of the conductive material from over the second ILD layer 126.

Figure 12:
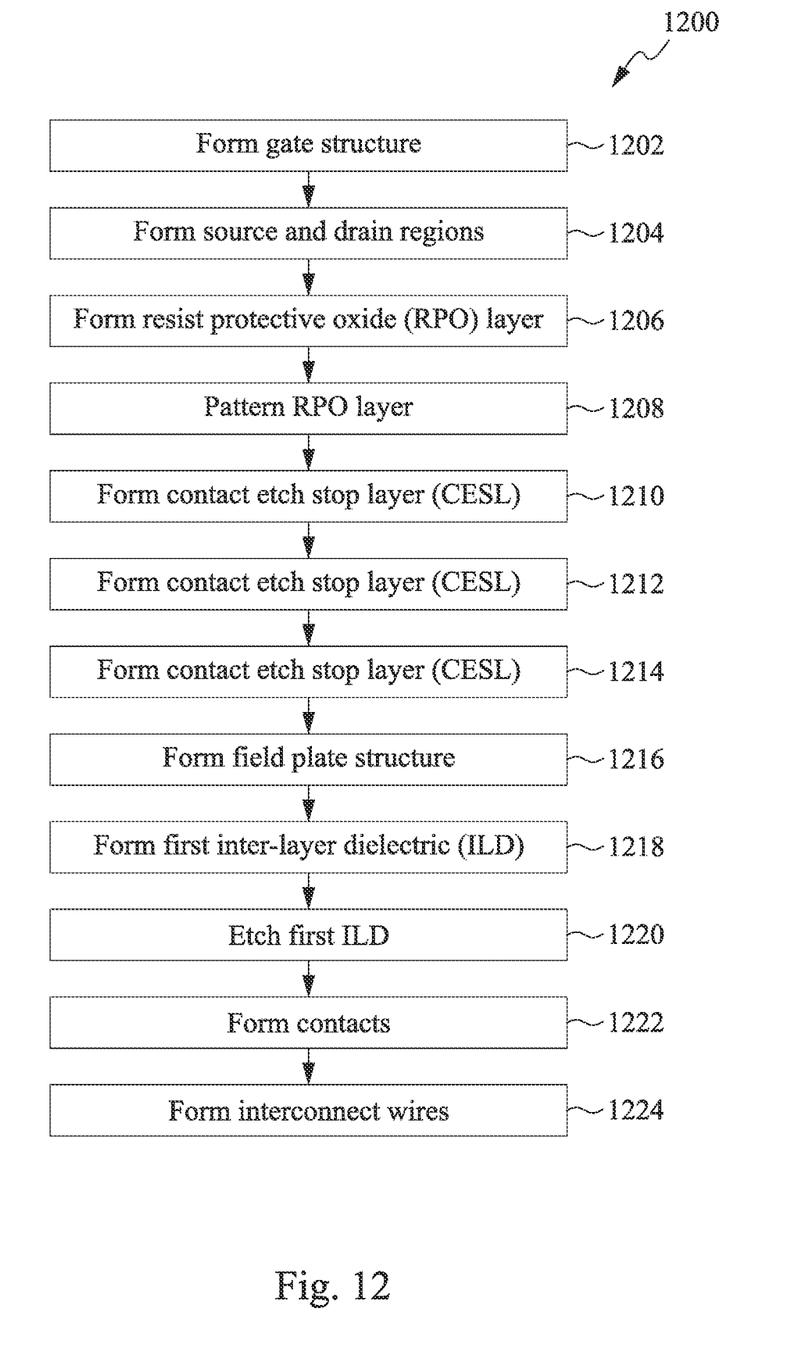
FIG. 12 illustrates a flow diagram of some embodiments of a method of forming a transistor device having a conductive etch stop layer that defines a field plate structure.

FIG. 12 illustrates a flow diagram of some embodiments of a method 1200 of forming a transistor device having a conductive etch stop layer that defines a field plate.

At 1202, a gate structure is formed over a substrate. FIG. 1 illustrates a cross-sectional view 100 corresponding to some embodiments of 1202.

At 1204, source and drain regions are formed within the substrate on opposing sides of the gate structure. In some embodiments, one or more additional doped regions (e.g., a body region, a drift region, etc.) may also be formed within the substrate. FIG. 1 illustrates a cross-sectional view 100 corresponding to some embodiments of 1204.

At 1206, a resistor protective oxide (RPO) is formed over the gate structure and laterally between the gate structure and the drain region. FIG. 2 illustrates a cross-sectional view 200 corresponding to some embodiments of 1206.

At 1208, the RPO is patterned over the gate structure and laterally between the gate structure and the drain region. FIG. 3 illustrates a cross-sectional view 300 corresponding to some embodiments of 1208.

At 1210, a contact etch stop layer (CESL) is formed on the RPO layer. FIG. 4 illustrates a cross-sectional view 400 corresponding to some embodiments of act 1210.

At 1212, a photoresist and/or hard mask layer is formed over the CESL. FIG. 5 illustrates a cross-sectional view 500 corresponding to some embodiments of 1212.

At 1214, a field plate opening is formed on in the photoresist and/or hard mask layer and optionally in either or both of the RPO and the CESL. FIG. 6 illustrates a cross-sectional view 600 corresponding to some embodiments of 1214.

At 1216, the field plate opening is filled or partially filled to form a field plate structure, and the photoresist and/or hard mask layer is removed. FIG. 7 illustrates a cross-sectional view 700 corresponding to some embodiments of 1216.

At 1218, a first inter-level dielectric (ILD) layer is formed over the CESL and the field plate structure. FIG. 8 illustrates a cross-sectional view 800 corresponding to some embodiments of 1212.

At 1220, the first ILD layer is selectively etched to define a plurality of openings. The plurality of openings have different depths. FIG. 9 illustrates a cross-sectional view 900 corresponding to some embodiments of 1220.

At 1222, the plurality of openings are filled with one or more conductive materials. FIG. 10 illustrates a cross-sectional view 1000 corresponding to some embodiments of 1222.

At 1224, a conductive interconnect wire is formed within a second ILD layer over the first ILD layer. FIG. 11 illustrates a cross-sectional view 1100 corresponding to some embodiments of act 1224.

As discussed in further detail above, a field plate structure is formed above a dielectric layer having a well-controlled thickness. The well-controlled thickness of the dielectric layer results in low yield loss for shorting of the field plate and the semiconductor substrate. The well-controlled thickness of the dielectric layer also results in well controlled electric field operation of the field plate.

One inventive aspect is a method of forming a semiconductor device. The method includes forming first and second conductive structures on a semiconductor substrate, forming one or more dielectric layers between the first and second conductive structures, covering the one or more dielectric layers with a first masking layer, forming a first opening in the first masking layer, depositing a conductive material in the first opening to form a field plate structure, and electrically connecting the field plate structure to another conductor.

In some embodiments, the first masking layer includes at least one of a photoresist layer and a hard mask layer.

In some embodiments, electrically connecting the field plate structure to the other conductor includes depositing an inter-layer dielectric (ILD) over the field plate structure, and electrically connecting the field plate structure to the other conductor through the ILD.

In some embodiments, electrically connecting the field plate structure to the other conductor further includes depositing the other conductor over the ILD, and forming a conductive contact through the ILD, where the conductive contact is electrically connected to the field plate structure and connected to the other conductor.

In some embodiments, the semiconductor device includes a transistor, the first conductive structure includes a gate structure of the transistor, and the second conductive structure includes a drain region of the transistor.

In some embodiments, forming the first opening in the first masking layer includes forming second masking layer over the first masking layer, forming a second opening in the second masking layer, and etching the first opening through the second opening.

In some embodiments, the one or more dielectric layers includes at least one of a resist protective oxide (RPO) and a contact etch stop layer (CESL).

In some embodiments, forming the first opening in the first masking layer includes forming the first opening through the first masking layer into the at least one of the RPO and the CESL.

Another inventive aspect is a method of forming a semiconductor device. The method includes forming first and second conductive structures on a semiconductor substrate, forming one or more dielectric layers between the first and second conductive structures, forming a field plate structure over at least a portion of the one or more dielectric layers, after forming the field plate structure, depositing an interlayer dielectric (ILD) over the field plate structure, and electrically connecting the field plate structure to another conductor through the ILD.

In some embodiments, electrically connecting the field plate structure to the other conductor includes depositing the other conductor over the ILD, and forming a conductive contact through the ILD, where the conductive contact is electrically connected to the field plate structure and connected to the other conductor.

In some embodiments, the semiconductor device includes a transistor, the first conductive structure includes a gate structure of the transistor, and the second conductive structure includes a drain region of the transistor.

In some embodiments, the one or more dielectric layers includes at least one of a resist protective oxide (RPO) and a contact etch stop layer (CESL).

In some embodiments, forming the field plate structure includes forming an opening in at least one of the RPO and the CESL, and depositing a conductive material in the opening.

Another inventive aspect is a semiconductor device. The semiconductor device includes a semiconductor substrate, first and second conductive structures on the semiconductor substrate, one or more dielectric layers between the first and second conductive structures, a field plate structure over at least a portion of the one or more dielectric layers, and a contact, distinct from the field plate structure, where the contact physically and electrically contacts the field plate structure.

In some embodiments, the field plate structure includes a first conductive material, and the contact includes a second conductive material, where the first and second conductive materials are different.

In some embodiments, the semiconductor device includes a transistor, the first conductive structure includes a gate structure of the transistor, and the second conductive structure includes a drain region of the transistor.

In some embodiments, the semiconductor device further includes an inter-layer dielectric (ILD), where the contact extends through the ILD to contact the field plate structure.

In some embodiments, the semiconductor device further includes a conductor, where the contact physically and electrically contacts the conductor.

In some embodiments, the one or more dielectric layers includes at least one of a resist protective oxide (RPO) and a contact etch stop layer (CESL).

In some embodiments, the field plate structure extends into at least one of the RPO and the CESL.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   first and second conductive structures on the semiconductor substrate;
   one or more dielectric layers between the first and second conductive structures;
   a conductive field plate structure disposed in the one or more dielectric layers, wherein an upper surface of the conductive field plate structure is substantially coplanar with an upper surface of the one or more dielectric layers;
   an interlayer dielectric (ILD) on the semiconductor substrate;
   a plurality of metal wire structures on the ILD;
   a first conductive contact, extending from a first of the plurality of metal wire structures toward the first conductive structure;
   a second conductive contact, extending from a second of the plurality of metal wire structures toward the second conductive structure; and
   a third conductive contact, extending from a third of the plurality of metal wire structures toward the conductive field plate structure, wherein the conductive field plate structure has a lateral width which is greater than a lateral width of the third conductive contact.

2. The semiconductor device of claim 1, wherein the conductive field plate structure comprises a first conductive material, and the third conductive contact comprises a second conductive material, wherein the first and second conductive materials are different.

3. The semiconductor device of claim 1, wherein the semiconductor device comprises a transistor, wherein the first conductive structure comprises a gate structure of the transistor, and wherein the second conductive structure comprises a drain region of the transistor.

4. The semiconductor device of claim 1, wherein the one or more dielectric layers comprises at least one of a resist protective oxide (RPO) and a contact etch stop layer (CESL).

5. The semiconductor device of claim 4, wherein the conductive field plate structure extends into at least one of the RPO and the CESL.

6. A semiconductor device, comprising:
   a semiconductor substrate;
   first and second conductive structures on the semiconductor substrate;

one or more dielectric layers between the first and second conductive structures;

a field plate structure disposed in the one or more dielectric layers, wherein an upper surface of the field plate structure is substantially coplanar with an upper surface of the one or more dielectric layers;

an inter-layer dielectric (ILD);

a conductor; and a contact, distinct from the field plate structure, wherein the contact extends through the ILD to physically and electrically contact the field plate structure and the conductor.

7. The semiconductor device of claim 6, wherein the field plate structure comprises a first conductive material, and the contact comprises a second conductive material, wherein the first and second conductive materials are different.

8. The semiconductor device of claim 6, wherein the semiconductor device comprises a transistor, wherein the first conductive structure comprises a gate structure of the transistor, and wherein the second conductive structure comprises a drain region of the transistor.

9. The semiconductor device of claim 6, wherein the one or more dielectric layers comprises at least one of a resist protective oxide (RPO) and a contact etch stop layer (CESL).

10. The semiconductor device of claim 9, wherein the field plate structure extends into at least one of the RPO and the CESL.

11. A semiconductor device, comprising:

a semiconductor substrate;

a first conductive structure on the semiconductor substrate;

a first conductive contact electrically coupled to the first conductive structure;

a second conductive structure on the semiconductor substrate;

a second conductive contact electrically coupled to the second conductive structure;

at least one dielectric layer between the first conductive structure and the second conductive structure;

a conductive field plate structure disposed in the at least one dielectric layer, wherein an upper surface of the conductive field plate structure is substantially coplanar with an upper surface of the at least one dielectric layer;

an interlayer dielectric (ILD) on the semiconductor substrate; and a third conductive contact electrically coupled to the conductive field plate structure and a metal wire structure disposed on the ILD, wherein a lateral width of the third conductive contact is smaller than a lateral width of the conductive field plate structure.

12. The semiconductor device of claim 11, wherein the conductive field plate structure comprises a first conductive material, and the third conductive contact comprises a second conductive material different from the first conductive material.

13. The semiconductor device of claim 11, wherein the semiconductor device comprises a transistor, and the first conductive structure comprises a gate structure of the transistor, and the second conductive structure comprises a drain region of the transistor.

14. The semiconductor device of claim 11, wherein the at least one dielectric layer comprises a resist protective oxide (RPO) layer.

15. The semiconductor device of claim 11, wherein the at least one dielectric layer comprises a contact etch stop layer (CESL).

16. The semiconductor device of claim 11, wherein the conductive field plate structure extends into the at least one dielectric layer.

17. The semiconductor device of claim 11, wherein the conductive field plate structure comprises a conductive etch stop material.

* * * * *